United States Patent
Yang et al.

(10) Patent No.: US 8,395,241 B2
(45) Date of Patent: Mar. 12, 2013

(54) THROUGH SILICON VIA GUARD RING

(75) Inventors: Cheng Yang, Shanghai (CN); Jiamin Qian, Shanghai (CN); Hai Wu, Shanghai (CN)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 12/918,579

(22) PCT Filed: Nov. 25, 2009

(86) PCT No.: PCT/CN2009/001315
§ 371 (c)(1),
(2), (4) Date: Aug. 20, 2010

(87) PCT Pub. No.: WO2011/063547
PCT Pub. Date: Jun. 3, 2011

(65) Prior Publication Data
US 2012/0228777 A1    Sep. 13, 2012

(51) Int. Cl.
*H01L 23/544* (2006.01)
*H01L 23/48* (2006.01)
(52) U.S. Cl. ............... 257/620; 257/774; 257/E23.145; 438/113
(58) Field of Classification Search .............. 257/620, 257/774, E23.145; 438/113
See application file for complete search history.

(56) References Cited

U.S. PATENT DOCUMENTS

| | | | | |
|---|---|---|---|---|
| 5,229,647 | A * | 7/1993 | Gnadinger | 257/785 |
| 6,022,791 | A * | 2/2000 | Cook et al. | 438/458 |
| 6,087,719 | A * | 7/2000 | Tsunashima | 257/686 |
| 6,239,495 | B1 * | 5/2001 | Sakui et al. | 257/777 |
| 6,577,013 | B1 * | 6/2003 | Glenn et al. | 257/777 |
| 6,710,461 | B2 * | 3/2004 | Chou et al. | 257/780 |
| 6,717,251 | B2 * | 4/2004 | Matsuo et al. | 257/686 |
| 7,087,452 | B2 * | 8/2006 | Joshi et al. | 438/68 |
| 7,906,848 | B2 * | 3/2011 | Kumagai et al. | 257/758 |
| 7,919,869 | B2 * | 4/2011 | Kumagai | 257/774 |
| 7,955,952 | B2 * | 6/2011 | Liu et al. | 438/462 |
| 2004/0061238 | A1 * | 4/2004 | Sekine | 257/774 |
| 2005/0093169 | A1 * | 5/2005 | Kajita | 257/774 |
| 2006/0180941 | A1 * | 8/2006 | Kirby et al. | 257/774 |
| 2007/0102792 | A1 * | 5/2007 | Wu | 257/620 |
| 2008/0096310 | A1 | 4/2008 | Modi | |

FOREIGN PATENT DOCUMENTS

CN     1890796 A     1/2007

OTHER PUBLICATIONS

International Search Report received for International Patent Application No. PCT/CN2009/001312, mailed on Sep. 2, 2010, 4 pages.

* cited by examiner

*Primary Examiner* — Nitin Parekh
(74) *Attorney, Agent, or Firm* — Winkle, PLLC (57) ABSTRACT

The present disclosure relates to forming a plurality of through silicon vias guard rings proximate the scribes streets of a microelectronic device wafer. The microelectronic device wafer includes a substrate wherein the through silicon via guard ring is fabricated by forming vias extending completely through the substrate. The through silicon via guard rings act as crack arresters, such that defects caused by cracks resulting from the dicing of the microelectronic wafer are substantially reduced or eliminated.

11 Claims, 11 Drawing Sheets

THROUGH SILICON VIA GUARD RING

BACKGROUND OF THE INVENTION

1. Field of Invention

The present disclosure relates generally to the field of dicing microelectronic device wafers into individual microelectronic dice. In at least one embodiment, the present disclosure relates to forming a plurality of through silicon vias in the scribes streets of a microelectronic device wafer.

2. State of the Art

In the production of microelectronic devices, integrated circuitry may be formed in and on microelectronic device wafers. A single microelectronic device wafer may contain a plurality of substantially identical integrated circuits, which are usually substantially rectangular and arranged in rows and columns. In general, two sets of mutually parallel dicing streets may extend perpendicular to each other over substantially the entire surface of the microelectronic device wafer between each discrete integrated circuit.

After the integrated circuits on the microelectronic device wafer have been subjected to preliminary testing for functionality (wafer sort), the microelectronic device wafer may be diced (cut apart), so that each area of functioning integrated circuitry becomes an individual microelectronic die that can be used to form a packaged microelectronic device. One exemplary microelectronic wafer dicing process may use a circular diamond-impregnated dicing saw, which travels down two mutually perpendicular sets of dicing streets lying between each of the rows and columns. Of course, the dicing streets are sized to allow passage of a wafer saw blade between adjacent integrated circuits without causing damage to the circuitry.

The microelectronic device wafer may have guard rings which substantially surround the integrated circuit. The guard rings may extend through an interconnect layer. The interconnect layer can comprise multiple layers consisting of metal trace layers separated by dielectric material layers on a substrate. The interconnect layer can provide routes for electrical communication between integrated circuit components within the integrated circuits, as well as to external interconnects. The guard ring may generally formed layer by layer as the interconnect layer is formed. The guard ring can assist in preventing external contamination encroaching into the integrated circuitry from within the interconnect layer.

Prior to dicing, the microelectronic device wafer may be mounted onto a sticky, flexible tape that may be attached to a ridge frame. The tape may continue to hold the microelectronic die after the dicing operation and during transport to subsequent assembly steps. The saw cuts a channel in the dicing street through the interconnect layer and the substrate.

However, in the dicing of microelectronic device wafers, the use of industry standard dicing saws may result in cracks in the microelectronic device wafer. These cracks can propagate into the wafer below the interconnect layer and may result the cracking and/or delamination of the layers in the interconnect layer. Such cracking and/or delamination may result in fatal defects in the integrated circuitry.

BRIEF DESCRIPTION OF THE DRAWINGS

The subject matter of the present disclosure is particularly pointed out and distinctly claimed in the concluding portion of the specification. The foregoing and other features of the present disclosure will become more fully apparent from the following description and appended claims, taken in conjunction with the accompanying drawings. It is understood that the accompanying drawings depict only several embodiments in accordance with the present disclosure and are, therefore, not to be considered limiting of its scope. The disclosure will be described with additional specificity and detail through use of the accompanying drawings, such that the advantages of the present disclosure can be more readily ascertained.

In the drawings.

DETAILED DESCRIPTION

In the following detailed description, reference is made to the accompanying drawings that show, by way of illustration, specific embodiments in which the claimed subject matter may be practiced. These embodiments are described in sufficient detail to enable those skilled in the art to practice the subject matter. It is to be understood that the various embodiments, although different, are not necessarily mutually exclusive. For example, a particular feature, structure, or characteristic described herein, in connection with one embodiment, may be implemented within other embodiments without departing from the spirit and scope of the claimed subject matter. In addition, it is to be understood that the location or arrangement of individual elements within each disclosed embodiment may be modified without departing from the spirit and scope of the claimed subject matter. The following detailed description is, therefore, not to be taken in a limiting sense, and the scope of the subject matter is defined only by the appended claims, appropriately interpreted, along with the full range of equivalents to which the appended claims are entitled. In the drawings, like numerals refer to the same or similar elements or functionality throughout the several views, and that elements depicted therein are not necessarily to scale with one another, rather individual elements may be enlarged or reduced in order to more easily comprehend the elements in the context of the present description.

Embodiments of the present description relate to the field of dicing microelectronic device wafers into individual microelectronic dice. In at least one embodiment, the present disclosure relates to forming a plurality of through silicon vias proximate the scribes streets of a microelectronic device wafer.

Figure 1:
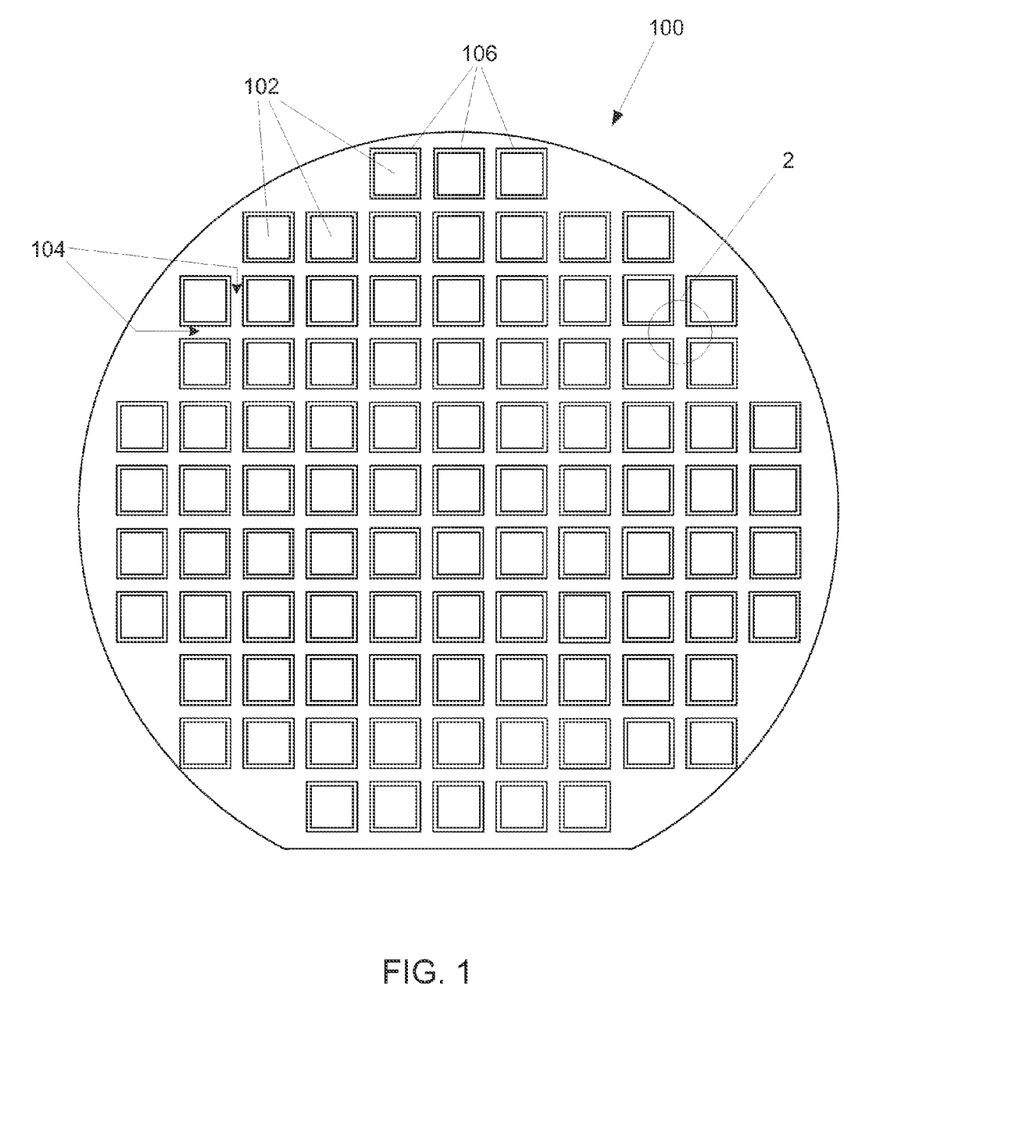
FIG. 1 is a top plan view of a microelectronic device wafer having a plurality of microelectronic devices formed thereon.
Figure 2:
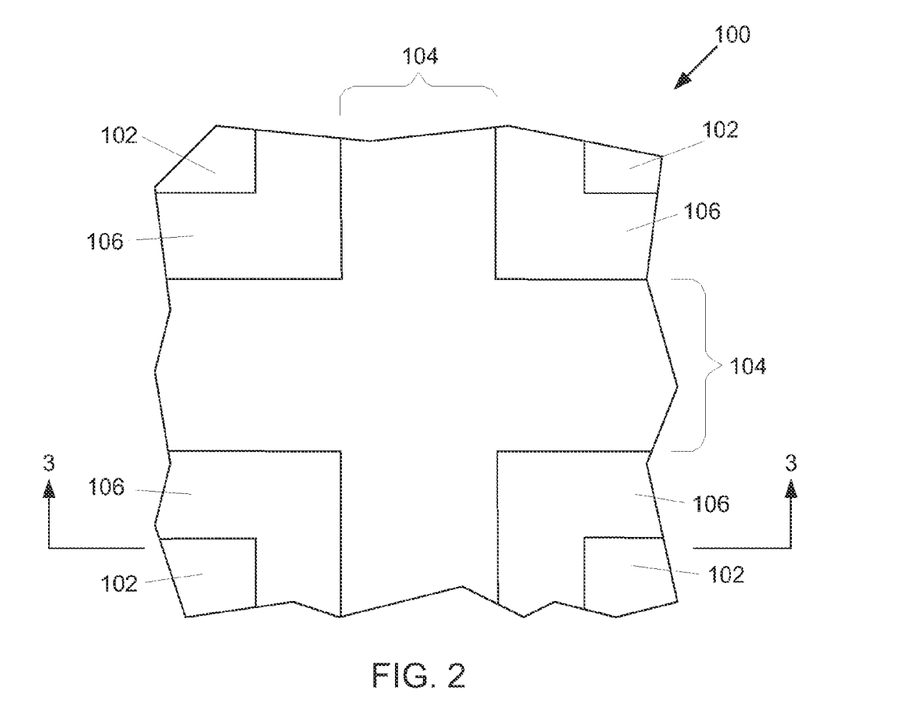
FIG. 2 is a top plan close-up view of insert 2 of FIG. 1 showing the dicing street areas.

In the production of microelectronic devices, integrated circuitry may formed in and on microelectronic device wafers. As shown in FIG. 1, a single microelectronic device wafer 100 may contain a plurality of substantially identical integrated circuits 102 (also referred to "active areas"), which are usually substantially rectangular and arranged in rows and columns. In general, two sets of mutually parallel dicing streets 104 may extend perpendicular to each other over substantially the entire surface of the microelectronic device wafer 100 between each discrete integrated circuit 102. It is understood that the integrated circuits 102 may be any circuit components, electrical connections, or combinations thereof, including but not limited to transistors, resistors, capacitors, conductive traces, and the like, which may form a microprocessor, a chipset, a memory device, an ASIC, and the like. As shown in FIGS. 1 and 2, the microelectronic device wafer 100 may have at least one interconnect guard ring 106, each of which substantially surrounds each integrated circuit 102, thereby isolating the integrated circuit 102 from the dicing streets 104.

Figure 3:
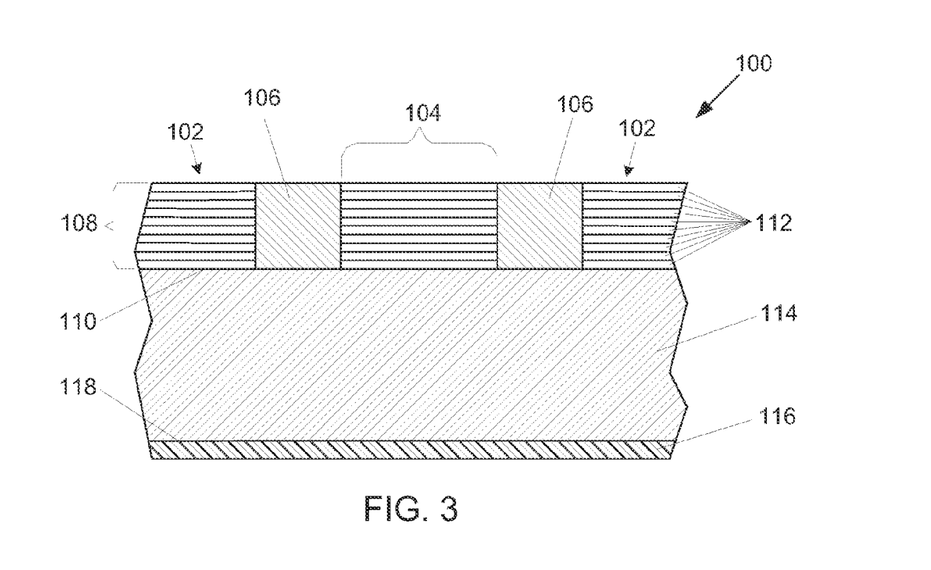
FIG. 3 is a side cross-sectional view of the dicing street areas of a microelectronic device wafer along line 3-3 of FIG. 2.

As shown in FIG. 3, the microelectronic device wafer 100 may comprise an interconnect layer 108 disposed on a first surface 110 of a substrate 114, which may be mounted by a second surface 118 thereof to a sticky, flexible tape 116. The substrate 114 may be any appropriate material, including, but not limited to, silicon, silicon-on-insulator, gallium arsenide, indium phosphide, and the like. It is, of course, understood that the use of the term "wafer" does not only include an entire wafer, but also includes portions thereof.

The interconnect guard rings 106 extend through an interconnect layer 108. The interconnect layer 108 may comprise layers 112 consisting of metal traces separated by dielectric material layers sequentially formed on a substrate 114. The dielectric material may include, but not limited to, silicon dioxide, silicon nitride, fluorinated silicon dioxide, carbon-doped silicon dioxide, silicon carbide, various polymeric dielectric materials, and the like. The metal traces may be patterned from electrically conductive materials, including, but not limited to copper, aluminum, silver, titanium, gold, alloys thereof, and the like. The methods and processes for fabricating the interconnect layer 108, as well as the minor constituent materials in the various layers thereof will be evident to those skilled in the art.

The interconnect layer 108 may provide routes for electrical communication between integrated circuit components within the integrated circuit 102, as well as to external interconnects (not shown), as will be understood by those skilled in the art. The interconnect guard ring 106 may be formed layer by layer as the interconnect layer 108 is formed and may be formed of stacked metal layers. The interconnect guard ring 106 may assist in preventing external contamination encroaching into the integrated circuitry 102 within the interconnect layer 108 through delamination and/or cracks caused by the subsequent dicing of the microelectronic device wafer 100.

Within the dicing streets 104, there may be test structures (not shown) that are composed of the same materials as the other parts of the interconnect layer 108. Between these test structures in the dicing street 104 and the interconnect guard ring 106 may be a region or regions composed entirely of dielectric material with no conductive material between the layers 112.

After the integrated circuits 102 on the microelectronic device wafer 100 have been subjected to preliminary testing for functionality (wafer sort), the microelectronic device wafer 100 may be diced (cut apart), so that each area of functioning integrated circuitry 102 becomes a microelectronic die (not shown) that can be used to form a packaged microelectronic device (not shown). As previously discussed, prior to dicing, the microelectronic device wafer 100 may be mounted onto a sticky, flexible tape 116 by its substrate second surface 118. The flexible tape 116 may be attached to a ridge frame (not shown). The flexible tape 116 may continue to hold the diced (singulated) microelectronic die (not shown) after the dicing operation and during transport to the subsequent assembly steps.

Figure 4:
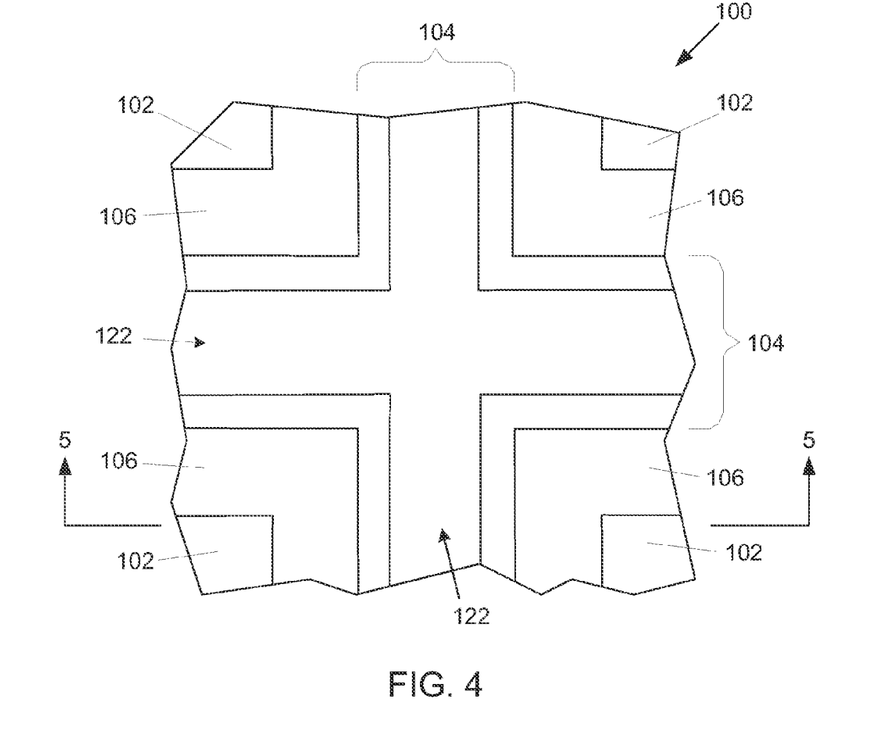
FIG. 4 is a top plan close-up view of the microelectronic device wafer after dicing.
Figure 5:
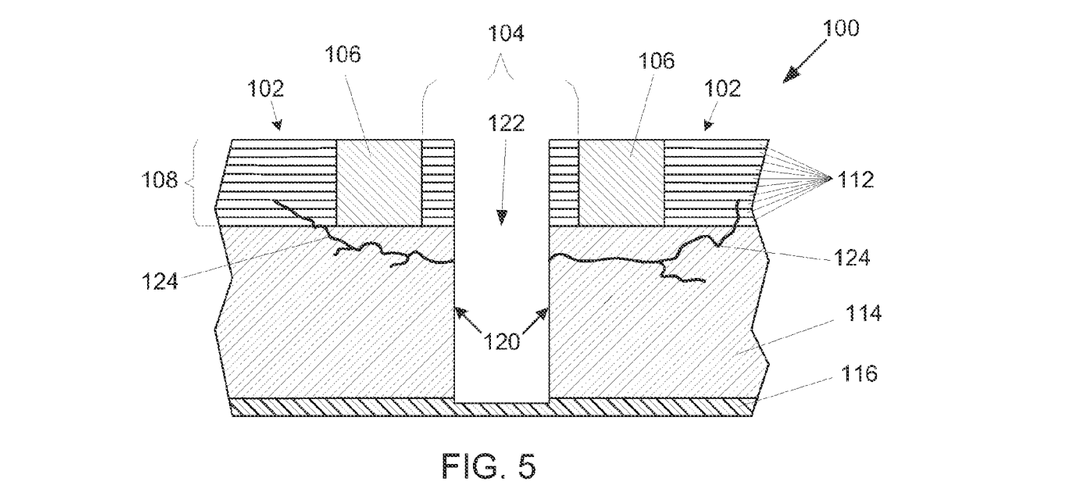
FIG. 5 is a side cross-sectional view of the dicing street areas of a microelectronic device wafer along line 5-5 of FIG. 4.

As shown in FIGS. 4 and 5, a saw (not shown), such as a circular diamond-impregnated dicing saw, may cut channels 122 down perpendicular sets of the dicing streets 104 lying between each of the rows and columns (see FIG. 1), through the interconnect layer 108 and the substrate 114. During the cutting (dicing process), the saw generally cuts into the flexible tape 116 to up to about one-third of its thickness. Of course, the dicing streets 104 are sized to allow passage of the wafer saw blade between adjacent integrated circuits 102 without causing damage to the integrated circuits 102.

However, the use of a dicing saw can create cracks 124 in the substrate 114, as shown in FIG. 5. As substrates 114 have become thinner and thinner in the fabrication of integrated circuits 102, such as with ultra-thin wafers (i.e., thickness of less than about 30 um), the cracks 124 have become more prevalent. Such cracks 124 can propagate through the substrate 114 and into the integrated circuit 102 areas (see FIGS. 1 and 4), which can result in the cracking or delamination of the layers 112 comprising the interconnect layer 108 of the integrated circuits 102 and/or the cracking of the circuit components (not shown) within the integrated circuit 102 area. The cracking of the interconnect layer 108 may be of a particular issue when the dielectric layers are made from brittle materials, such as low-K dielectric materials, including but not limited to hafnium silicate, zirconium silicate, hafnium dioxide, and zirconium oxide. Thus, the cracks 124 may lead to significant yield loss or device failures.

It is noted that although the interconnect guard ring 106 may be useful in preventing crack propagation through the layers 112 of the interconnect layer 108, the interconnect guard ring 106 cannot prevent the cracks 124 from extending through substrate 114 under the interconnect guard ring 106 and damage the integrated circuits 102 and/or the interconnect to layer 108. Furthermore, although these cracks 124 may not his extend to the integrated circuit 102 areas immediately after dicing, those cracks 124 can propagate toward the integrated circuit 102 due to mechanical and thermal stresses which may occurs during subsequent fabrication processes. Such processes may include, but are not limited to, microelectronic die attachment, wire bonding, flip chip reflow attachment process, encapsulation/mold/capping process, and the like, as will be understood to those skilled in the art.

Figure 6:
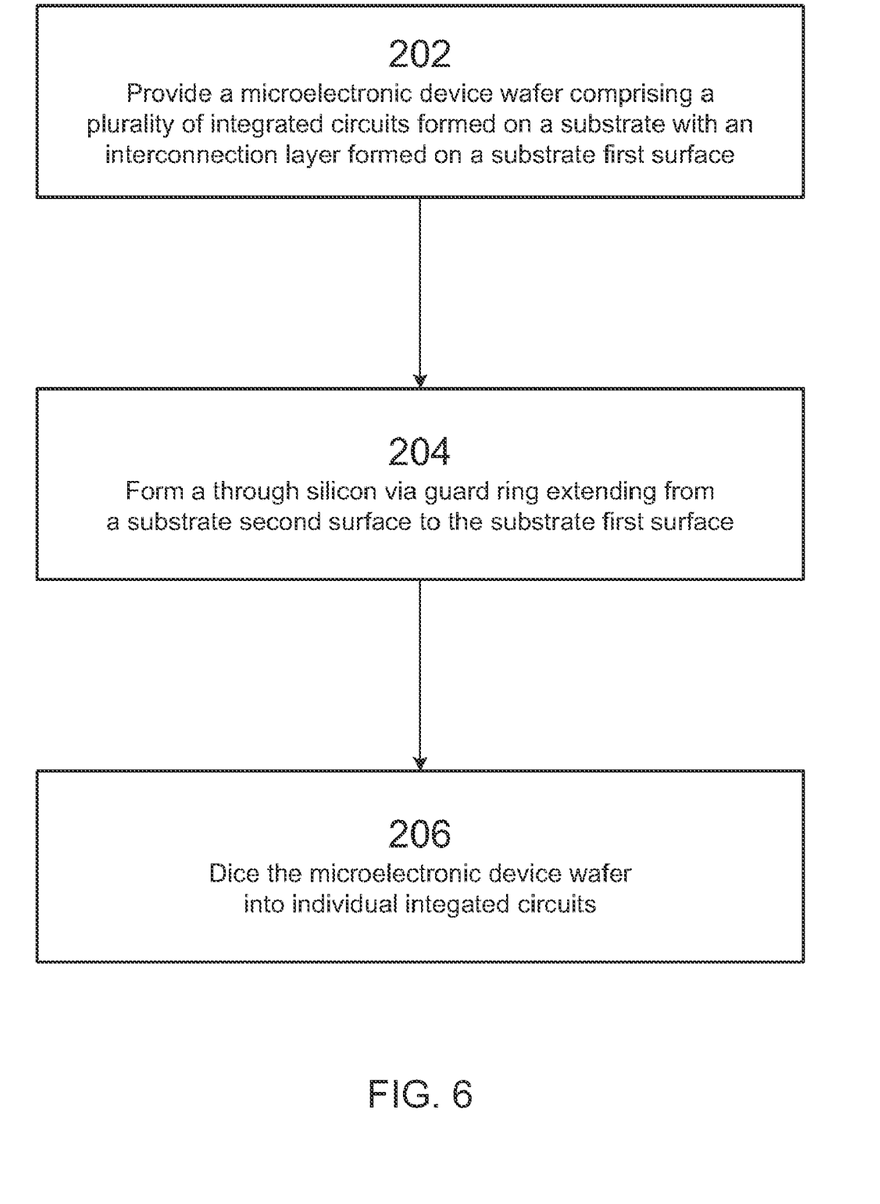
FIG. 6 is a flow diagram illustrating a process of forming the through silicon via guard ring.

An embodiment to eliminate or greatly reduced cracks propogating in the substrate can be illustrated in a flow chart as shown in FIG. 6. Block 202 may represent providing a microelectronic device wafer comprising a plurality of integrated circuits formed on a substrate with an interconnection layer formed on a first surface of the substrate. Block 204 may represent forming a through silicon via guard ring extending from a second surface of the substrate to the first surface of the substrate. Block 206 may represent dicing the microelectronic device wafer into individual integrated circuits. Embodiments of this process will be further defined in the description of FIGS. 7-14.

It is understood the term "through silicon via" is a term of art. The term is used to describe a via through a substrate used in the fabrication of an integrated circuit, and is not necessarily limited to a "silicon" substrate. Thus, the term as used herein is also not so limited.

Figure 7:
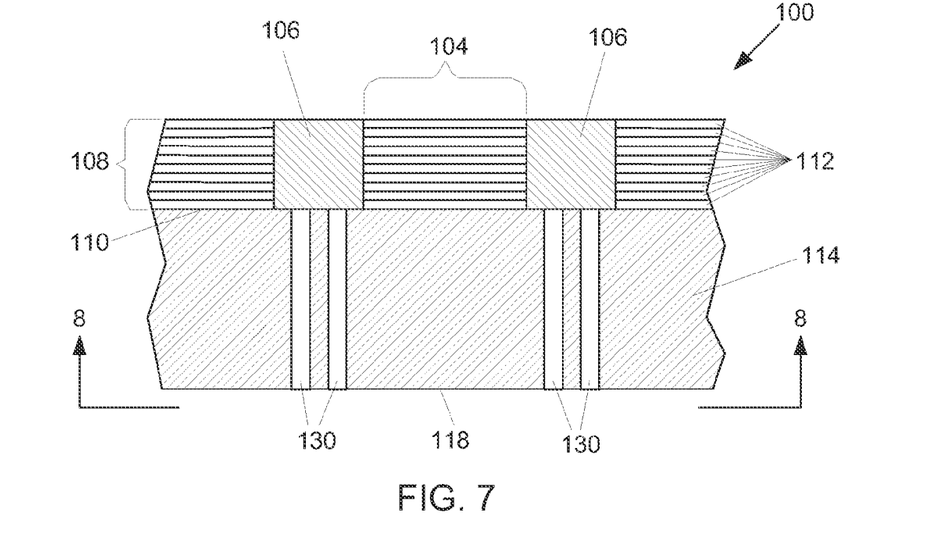
FIG. 7 is a side cross-sectional view of through silicon via guard rings in a microelectronic device wafer.

FIG. 7 illustrates through silicon via guard rings 130 formed from the substrate second surface 118 to the substrate first surface 110. In one embodiment, the through silicon via guard rings 130 may be position to extend from the substrate second surface 118 to the substrate first surface 110, wherein the through silicon via guard rings 130 abut the interconnect guard ring 106 at the substrate first surface 110.

Figure 8:
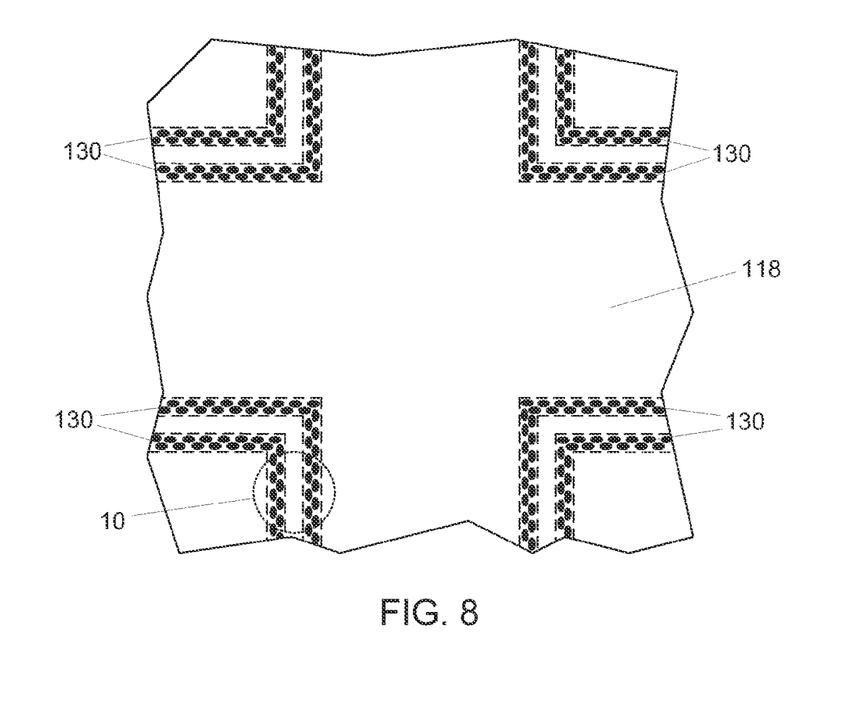
FIG. 8 is a bottom plan view of the silicon via guard rings in the microelectronic device wafer along ling 8-8 of FIG. 7.
Figure 9:
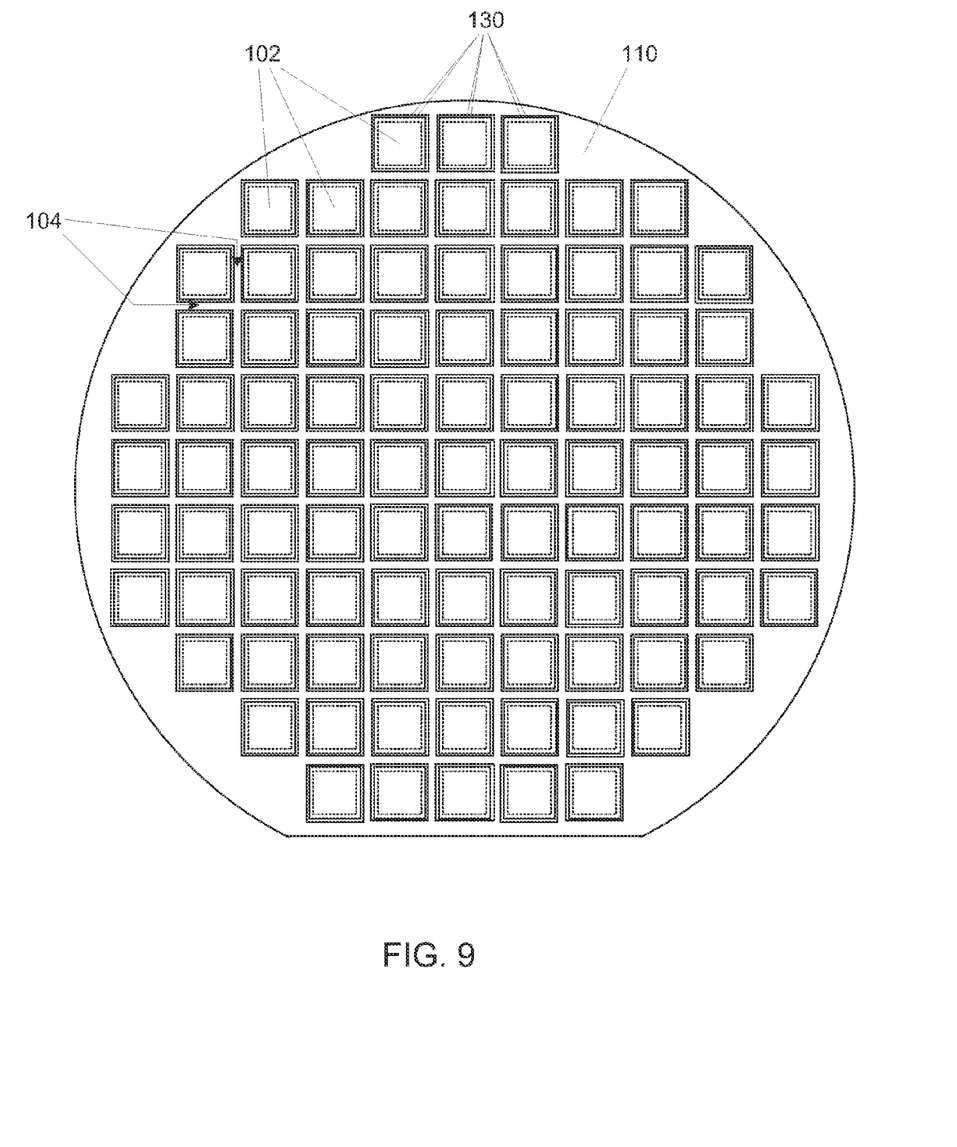
FIG. 9 is a bottom plan view of a microelectronic device wafer having a plurality of through silicon via guard rings from therein.
Figure 10:
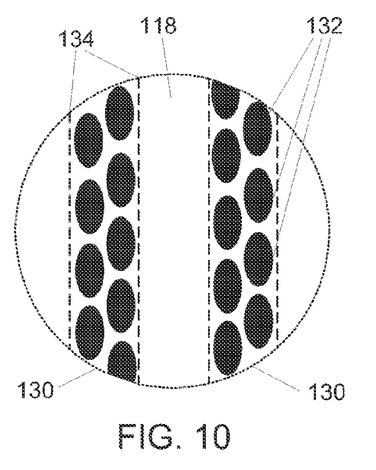
FIGS. 10 and 11 are close-up plan views of inset 10 of FIG. 8 showing oval and round vias, respectively, forming the through via guard rings.
Figure 11:
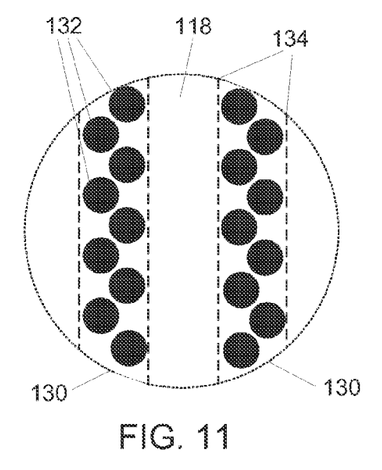

As shown in FIGS. 8, 10, and 11, the through silicon guard rings 130 may be formed as a plurality of vias 132 which are formed in a pattern, such as defined by dash lines 134. It is understood that the dashed lines 134 shown in FIGS. 8, 10, and 11 are not necessarily physical structures, but rather illustration an embodiment of the pattern in which the vias 132 can be formed within. As shown in FIG. 9, each of the through silicon via guard rings 130 may surround each integrated circuit 102 area (illustrated as dashed lines, as the element resides on the reverse side of the microelectronic device wafer 100) in a fashion similar to the interconnect guard ring 106, as shown in FIG. 1.

Referring to FIGS. 10 and 11, the vias 132 may have any appropriate shape to arrest a crack that may form in the substrate 114. For example, the vias 132 illustrated in FIG. 10 are substantially oval in cross-section, and the vias 132 illustrated in FIG. 11 are substantially round in cross-section. Of course, the via 132 cross-section may be any shape; however, as will be understood to those skilled in the art, cross-sectional shapes with curved edges or side tend to be more efficient at arresting cracks propagating through substantially solid materials cross-sectional shapes that have sharp edges.

Figure 12:
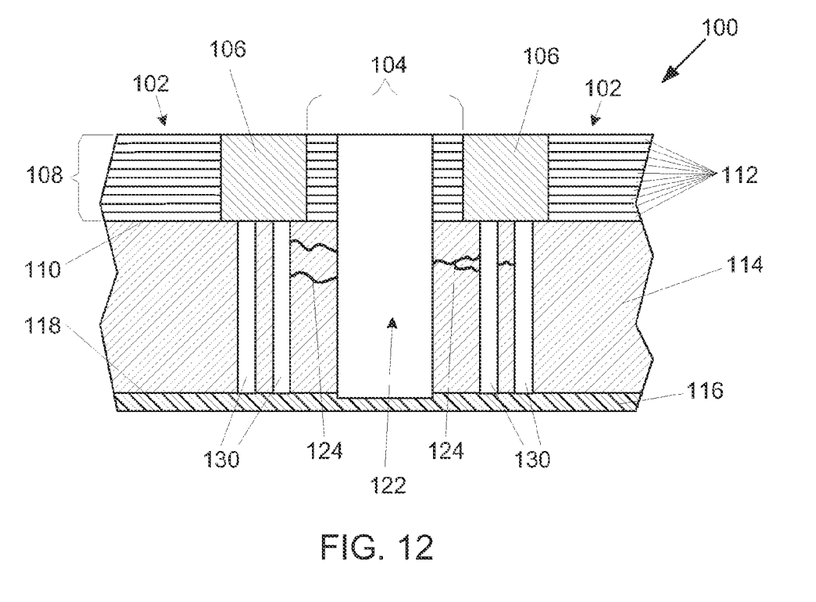
FIG. 12 is a side cross-sectional view of the through silicon via guard rings and dicing of the microelectronic device wafer.

Prior to dicing, the microelectronic device wafer 100 may be mounted onto the sticky, flexible tape 116 that is attached to a ridge frame (not shown). The flexible tape 116 may continue to hold the microelectronic die after the dicing operation and during transport to subsequent assembly steps. As shown in FIG. 12, a saw (not shown), such as a circular diamond-impregnated dicing saw, may cut channels 122 down perpendicular sets of the dicing streets 104 lying between each of the rows and columns (see FIG. 1), through the interconnect layer 108 and the substrate 114. If the use of a dicing saw creates cracks 124 in the substrate 114, the cracks 124 may encounter one or more vias 132 of the through silicon via guard ring 130, thereby arresting or stopping the crack 124. It is understood that cracks 124 may form anywhere proximate the area contacted by the saw including the first surface 110, and second surface 118, and the edges faces 120 formed by the saw.

FIGS. 8-11 illustrate two separate through silicon via guard rings 130 surrounding each individual integrated circuit 102. However, it is understood that any number of through silicon via guard rings 130 can be fabricated. Furthermore, as shown in FIGS. 8, 10, and 11, the vias 132 are shown to be aligned approximately two abreast, but it is understood that the vias 132 may be arranged in any effective fashion. It is understood that the vias 132 may be arranged and shaped in the manner such that the wafer 100 maintains sufficient structure integrity so that cracks do not form between the vias 132 during subsequent handling and attachment of the substrate second surface 118 to the flexible tape 116.

In one embodiment, the vias 132 are substantially oval having a length of between about 10 um and 20 um, and a width of between about 5 um and 10 um. In another embodiment, the vias 132 are substantially circular having the diameter of between about 5 um and 20 um.

Figure 13:
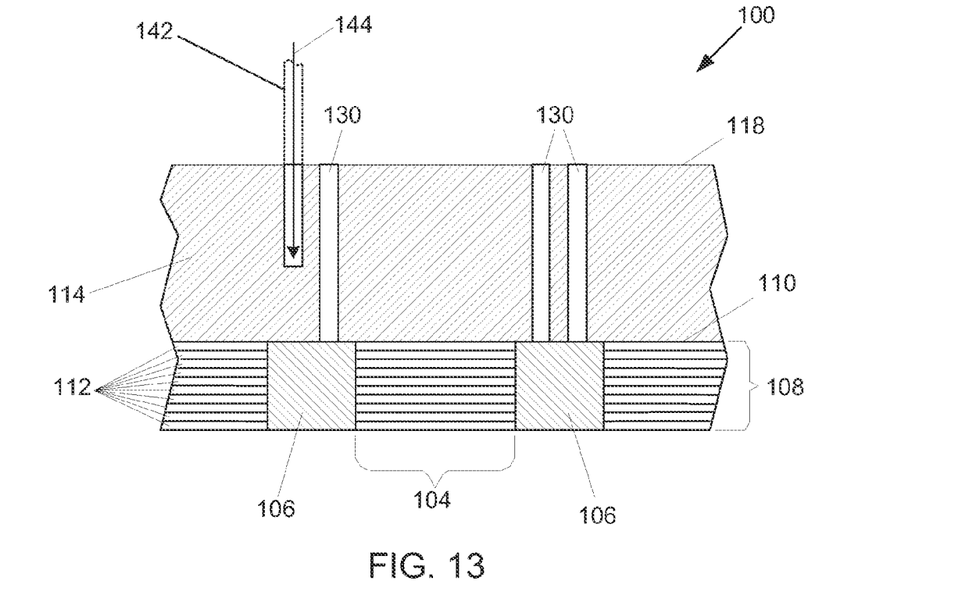
FIG. 13 is a side cross-sectional view of forming the through silicon via guard rings with a laser or ion milling device.

The vias 132 may be formed in any manner known in the art. In one embodiment, the vias may be from by laser ablation or ion milling. As shown in FIG. 13, a beam 142 (either laser or ion) directed toward the substrate second surface 118 (shown as direction 144). The beam 142 may be positioned substantially perpendicular to the substrate second surface 118 and may be positioned such that the through silicon via guard ring 130 will be formed to extend from the substrate second surface 118 to the interconnect guard ring 106. Although the guard rings 130 are shown to be so positioned, it is understood that the through silicon via guard rings 130 may also extend from the substrate second surface 118 to the interconnect layer 108 within the dicing streets 104. Additionally, although the beam is shown to span a width of the through silicon via guard ring 130, it is understood that the beam 142 is sized and shaped to form each individual via 132 (see FIGS. 8, 10, and 11).

In one embodiment, the beam 142 may be a laser beam generated by a laser, such as a Nd:YAG Laser (amplifying medium of neodymium-doped yttrium aluminium garnate (YAG)), wherein the lasers ablate away at least a portion of the substrate 114, thereby forming the vias 132.

Figure 14:
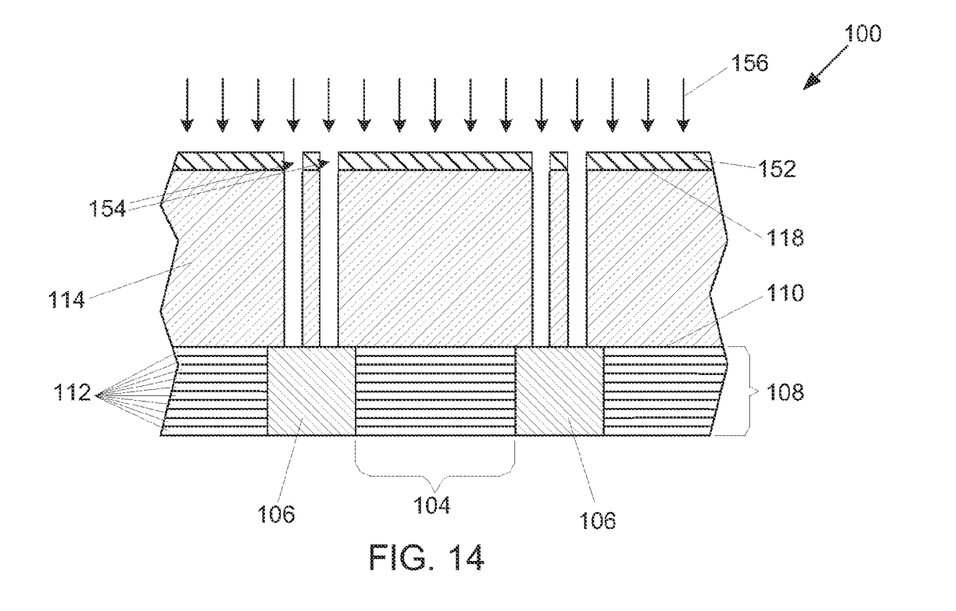
FIG. 14 is a side cross-sectional view of forming the through silicon via guard rings by etching.

In another embodiment, the vias 132 may be formed by etching, either wet or dry etching. As shown in FIG. 14, a mask 152 may be patterned on the substrate second surface 118. A mask 152 may be a photoresist material that may be patterned by photolithography techniques known in the art, on the substrate second surface 118 with a plurality of openings 154 therethrough. The plurality of openings 154 may be positioned such that the through silicon via guard rings 130 may be formed to extend from the substrate second surface 118 to the interconnect guard ring 106. Although the guard rings 130 are shown to be so positioned, it is understood that the through silicon via guard rings 130 may also extend from the microelectronic device wafer second surface 118 to the interconnect layer 108 within the dicing streets 104. Additionally, although the openings 154 are shown to span a width of the through silicon via guard ring 130, it is understood that the openings 154 are sized and shaped to form each individual via 132 (see FIGS. 8, 10, and 11).

Once the mask 152 is patterned on the substrate second surface 118, the substrate 114 is etched through the openings 154 to form the plurality of vias 132 (see FIGS. 8, 10, and 11). The etching may be achieved through a wet etch, such as by a solution of potassium hydroxide, a solution of tetramethylammonium hydroxide, and/or other wet etch solutions known in the art. The etching of the vias 132 may also be achieved through a dry etch, such as by reactive ion etching, sputter etching, and vapor phase etching, as will be understood to those skilled in the art. The etching materials (whether used by wet or dry etching) are illustrated in FIG. 14 as arrows 156. When the formation of the vias 132, and thereby the formation of the through silicon via guard ring 130, is completed, the mask 152 may then be removed, such as by an ashing process known in the art to form the structure shown in FIG. 7.

The incorporation of the through silicon via guard rings 130 to provide a crack stop path can allow for the use of a mechanical wheel saw for dicing ultra thin wafers (less than 30 um) without cracking the integrated circuitry from cracks caused from dicing. Thus, the use of the through silicon via guard rings 130 may greatly improve the assembly yield of devices using ultra thin wafers.

Figure 15:
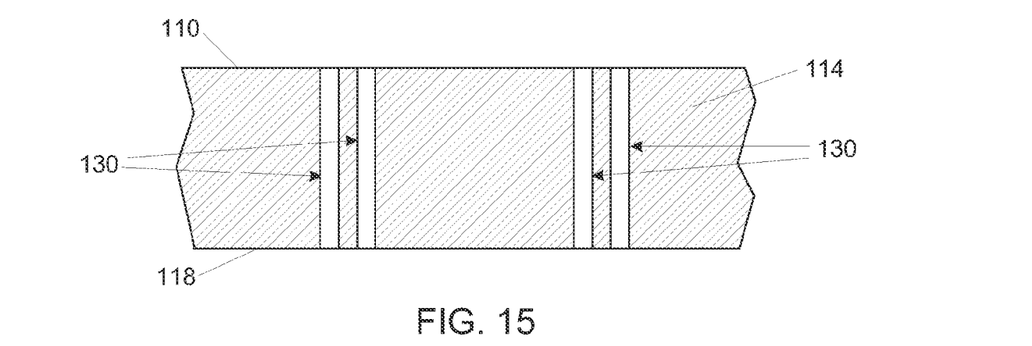
FIG. 15 is a side cross-sectional view of a substrate having through silicon via guard rings formed therein.
Figure 16:
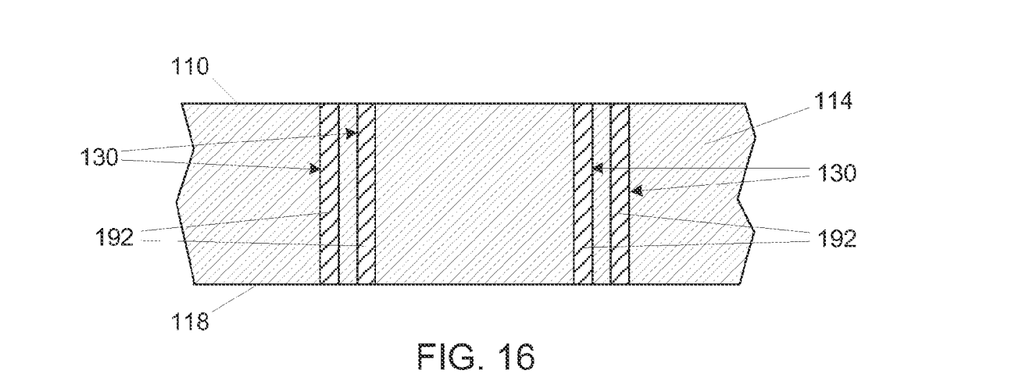
FIG. 16 is a side cross-sectional view of the substrate of FIG. 15 having the vias of the through silicon via guard rings filled with a material.
Figure 17:
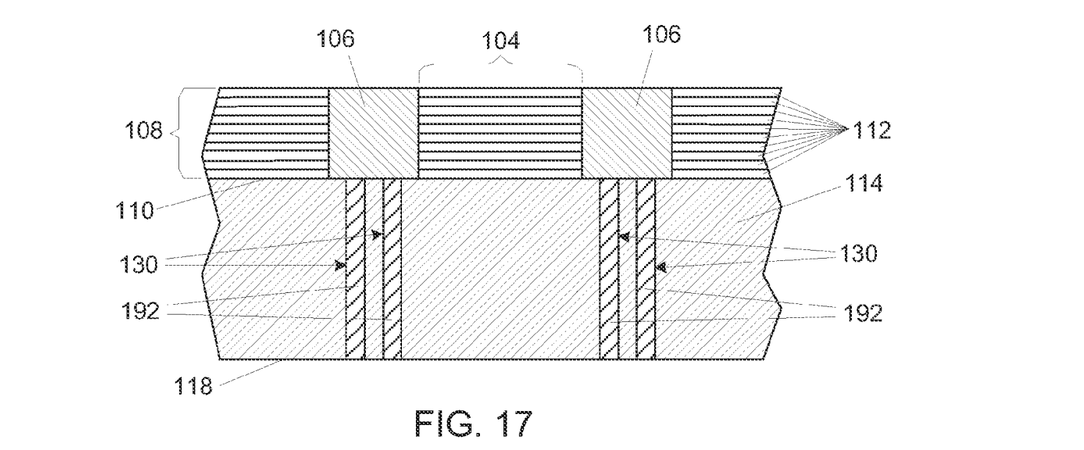
FIG. 17 is a side cross-sectional view of the substrate of FIG. 16 having an interconnect layer formed thereon.

It will be understood the used of through silicon via interconnects may be used in stacked devices, such as logic and memory stacks. Through silicon via interconnects are vias extending through a substrates which are filed with electrically conductive material which can be used for communication or power between the stacked devices. From process point of view, if through silicon via interconnects are being formed by a particular method in the fabrication of via, then the through silicon via guard ring can be formed at the same time for a nominal overall cost. This process is illustrated in FIGS. 15, 16, and 17. As shown in FIG. 15, the substrate 114 is provided and the plurality of vias 132 (see FIGS. 8, 10, and 11) are formed through the substrate 114 to form the through silicon via guard rings 130. The vias 132 may be formed by any method known in the art, including but not limited to the methods described for FIGS. 13 and 14.

As shown in FIG. 16, the vias (see FIGS. 8, 10, and 11) are at least partially filled with a material 192. Although the material 192 is shown to fill the entire through silicon via guard rings 130, it is understood that the material 192 filling each individual via 132 (see FIGS. 8, 10, and 11). The material 192 may be electrically conductive or non-conductive. If the material 192 is conductive, it may be formed by plating or other such methods. If through silicon via interconnects are being formed at the same time, then the conductive material 192 will be formed in the same manner as the filling of the through silicon via interconnects. If the material 192 is non-conductive, then the material 192 may be formed by deposition processes and the like.

As shown in FIG. 17, after the material 192 is formed within the vias 132 (see FIGS. 8, 10, and 11), the interconnect layer 108 is formed on the substrate first surface 110 and sent to be diced, as previously described. The use of the material 192 prevents the interconnect layer 108 from moving partially into the vias 132 (see FIGS. 8, 10, and 11) of the through silicon via guard rings 130.

Figure 18:
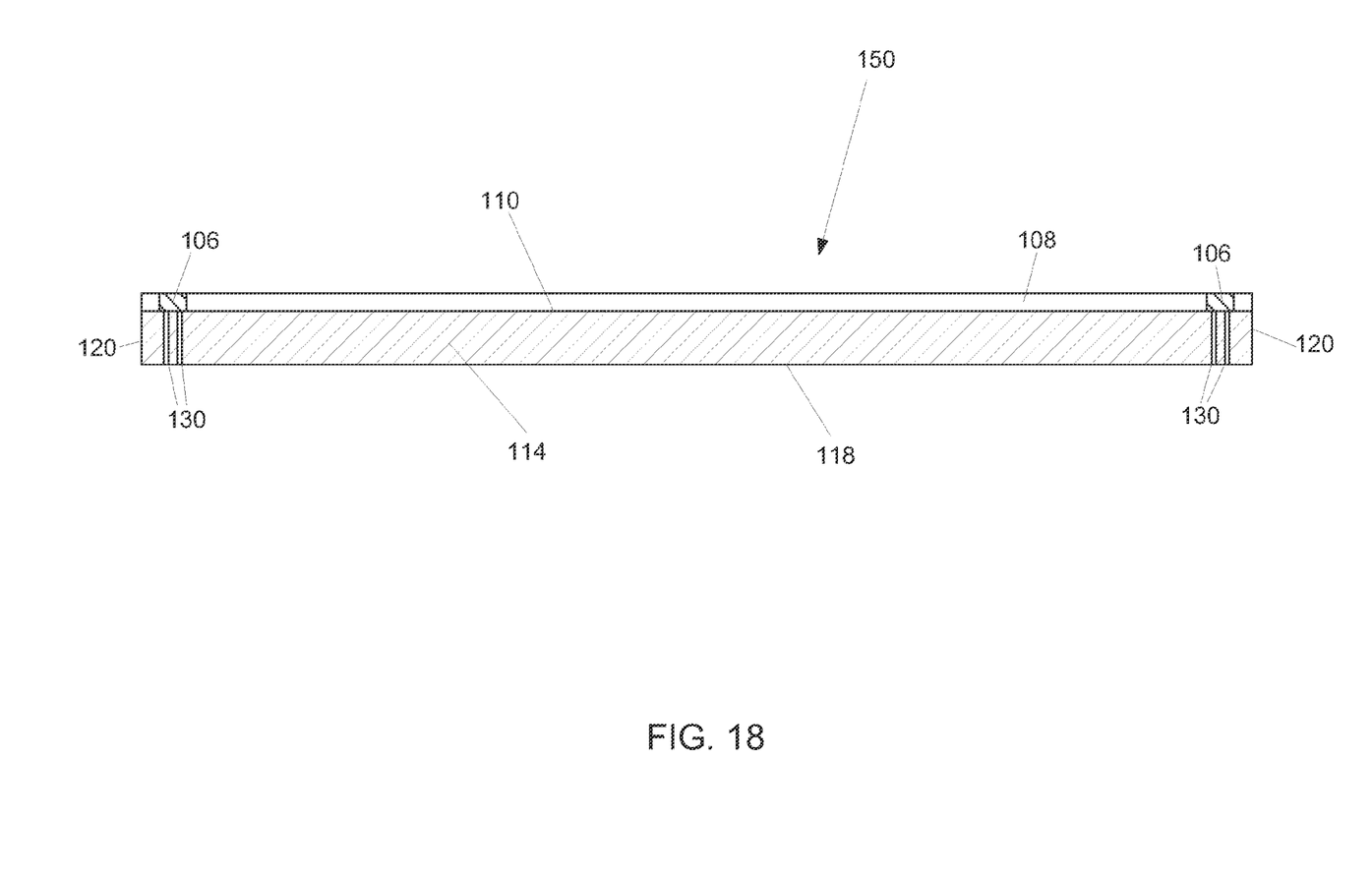
FIG. 18 is a side cross-sectional view of a microelectronic die after the dicing of the microelectronic device wafer.

FIG. 18 illustrates a microelectronic die 150 after dicing and having a through silicon via guard 130, as described in this disclosure. The microelectronic die 150 may be a microprocessor, a chipset, a memory device, an ASIC, or the like.

Figure 19:
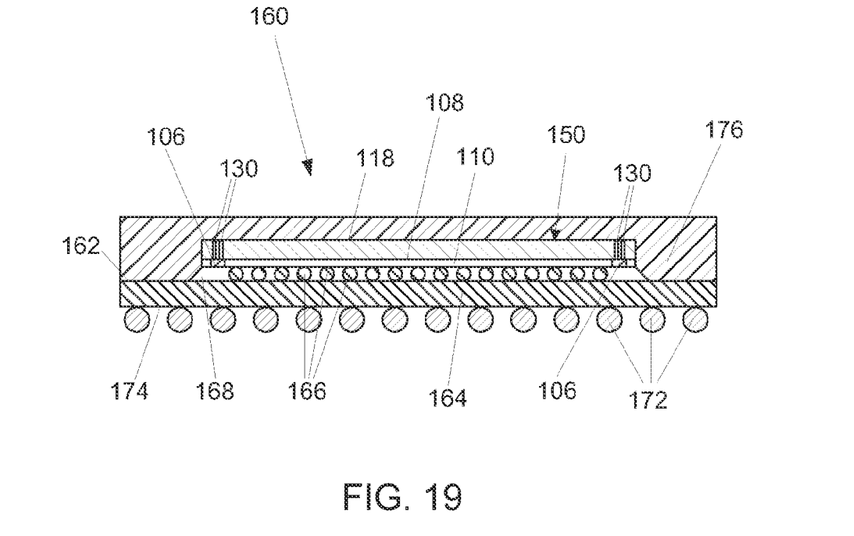
FIGS. 19 and 20 are a side cross-sectional view of a microelectronic device packages including the microelectronic die of FIG. 15.

FIG. 19 illustrates a microelectronic device package 160, known as a Flip Chip Molded Matrix Array Package (FC-MMAP). The microelectronic device package 160 may include the microelectronic die 150 (such as a microprocessor, a chipset, a memory device, an ASIC, and the like) attached by its interconnect layer 108 to a first surface 162 of a carrier substrate 164 (such as an interposer, a mother-board, a back surface of another microelectronic die, or the like) through a plurality of interconnects 166 (such as solder balls) extend from bond pads (not shown) on the microelectronic die interconnect layer 108 to land pads (not shown) on the carrier substrate first surface 162 to make electrical contact therebetween, as will be understood by those skilled in the art. An underfill material 168 is dispersed between the microelectronic die interconnect layer 108 and the carrier substrate first surface 162. The underfill material 168 provides mechanical support, contamination protection, and improves package reliability. The carrier substrate 164 also includes a plurality of external contacts 172 (such as solder balls) attached to a second surface 174 thereof. These external contacts 172 are used to connect the package to an external component (not shown), as will be understood to those skilled in the art. The microelectronic die 150 and exposed carrier substrate first surface 162 are encapsulated in a molding material 176 to prevent physical and chemical damage.

Figure 20:
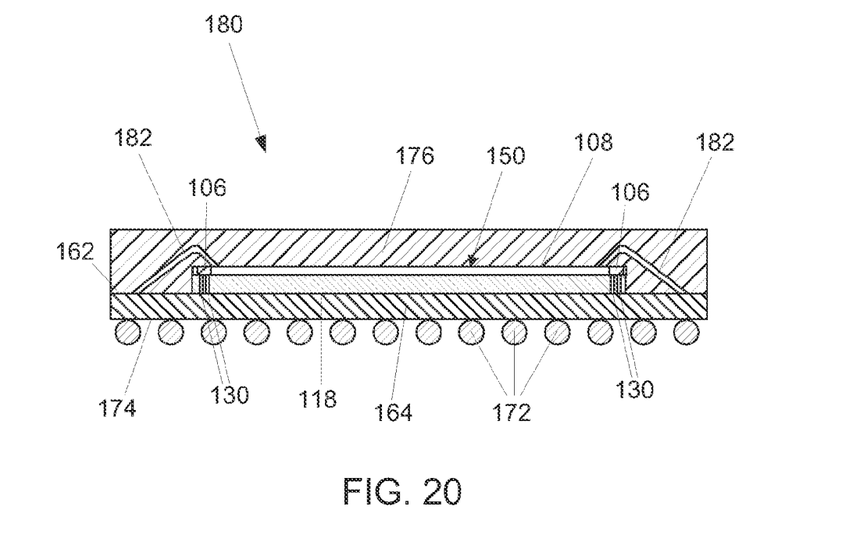

FIG. 20 illustrates a microelectronic device package 180, known as a Wire Bonded Molded Matrix Array Package (WB-MMAP). The microelectronic device package 180 may include the microelectronic die 150 (such as a microprocessor, a chipset, a memory device, an ASIC, and the like) attached by a substrate second surface 118 to the carrier substrate first surface 162. A plurality of bond wires 182 extend from bond pads (not shown) on the microelectronic die interconnect layer 108 to land pads (not shown) on the carrier substrate first surface 162 to make electrical contact therebetween, as will be understood by those skilled in the art. The carrier substrate 164 also includes a plurality of external contacts 172 attached to a second surface 174 thereof. These external contacts 172 connect the package to an external component (no shown), as will be understood to those skilled in the art. The microelectronic die 150 and bond wires 182 are encapsulated in a molding material 176 to prevent physical and chemical damage.

The detailed description has described various embodiments of the devices and/or processes through the use of illustrations, block diagrams, flowcharts, and/or examples. Insofar as such illustrations, block diagrams, flowcharts, and/or examples contain one or more functions and/or operations, it will be understood by those skilled in the art that each function and/or operation within each illustration, block diagram, flowchart, and/or example can be implemented, individually and/or collectively, by a wide range of hardware, software, firmware, or virtually any combination thereof.

The described subject matter sometimes illustrates different components contained within, or connected with, different other components. It is understood that such illustrations are merely exemplary, and that many alternate structures can be implemented to achieve the same functionality. In a conceptual sense, any arrangement of components to achieve the same functionality is effectively "associated" such that the desired functionality is achieved. Thus, any two components herein combined to achieve a particular functionality can be seen as "associated with" each other such that the desired functionality is achieved, irrespective of structures or intermediate components. Likewise, any two components so associated can also be viewed as being "operably connected", or "operably coupled", to each other to achieve the desired functionality, and any two components capable of being so associated can also be viewed as being "operably couplable", to each other to achieve the desired functionality. Specific examples of operably couplable include but are not limited to physically mateable and/or physically interacting components and/or wirelessly interactable and/or wirelessly interacting components and/or logically interacting and/or logically interactable components.

It will be understood by those skilled in the art that terms used herein, and especially in the appended claims are generally intended as "open" terms. In general, the terms "including" or "includes" should be interpreted as "including but not limited to" or "includes but is not limited to", respectively. Additionally, the term "having" should be interpreted as "having at least".

The use of plural and/or singular terms within the detailed description can be translated from the plural to the singular and/or from the singular to the plural as is appropriate to the context and/or the application.

It will be further understood by those skilled in the art that if an indication of the number of elements is used in a claim, the intent for the claim to be so limited will be explicitly recited in the claim, and in the absence of such recitation no such intent is present. Additionally, if a specific number of an introduced claim recitation is explicitly recited, those skilled in the art will recognize that such recitation should typically be interpreted to mean "at least" the recited number.

The use of the terms "an embodiment," "one embodiment," "some embodiments," "another embodiment," or "other embodiments" in the specification may mean that a particular feature, structure, or characteristic described in connection with one or more embodiments may be included in at least some embodiments, but not necessarily in all embodiments. The various uses of the terms "an embodiment," "one embodiment," "another embodiment," or "other embodiments" in the detailed description are not necessarily all referring to the same embodiments.

While certain exemplary techniques have been described and shown herein using various methods and systems, it should be understood by those skilled in the art that various other modifications may be made, and equivalents may be substituted, without departing from claimed subject matter or spirit thereof. Additionally, many modifications may be made to adapt a particular situation to the teachings of claimed subject matter without departing from the central concept described herein. Therefore, it is intended that claimed subject matter not be limited to the particular examples disclosed, but that such claimed subject matter also may include all implementations falling within the scope of the appended claims, and equivalents thereof.

What is claimed is:

1. A microelectronic die, comprising:
    a substrate having a first and second surface and an interconnect layer disposed on the substrate first surface, the substrate including an integrated circuits formed proximate the substrate first surface; and
    an interconnect guard ring within the interconnect layer and proximate the substrate edge wherein at least one of said plurality of vias substantially abuts said interconnect guard ring; and
    a plurality of vias proximate at least one edge of the substrate and extending from the substrate first surface to the substrate second surface.

2. The microelectronic die of claim 1, wherein the interconnect guard ring substantially surrounds the integrated circuit.

3. The microelectronic die of claim 1, wherein the plurality of vias substantially surround the integrated circuit.

4. The microelectronic die of claim 1, wherein the plurality of vias are filled.

5. A microelectronic device package, comprising:
    a carrier substrate having a first surface and a second surface; and
    a microelectronic die electrically coupled to the carrier substrate, wherein the microelectronic die comprises:
        a substrate having a first and second surface and an interconnect layer disposed on the substrate first surface, the substrate including an integrated circuits formed proximate the substrate first surface; and
        an interconnect guard ring within the interconnect layer and proximate the substrate edge, wherein at least one of said plurality of vias substantially abuts said interconnect guard ring; and
        a plurality of vias proximate at least one edge of the substrate and extending from the substrate first surface to the substrate second surface.

6. The microelectronic device package of claim 5, further comprising the microelectronic die substrate second surface attached to the carrier substrate first surface.

7. The microelectronic device package of claim 6, wherein the microelectronic die is electrically coupled to the carrier substrate through a plurality of bond wires.

8. The microelectronic device package of claim 5, wherein the microelectronic die is electrically coupled to the carrier substrate through a plurality of interconnects extending from the interconnect layer and the carrier substrate first surface.

9. The microelectronic die of claim 5, wherein the interconnect guard ring substantially surrounds the integrated circuit.

10. The microelectronic die of claim 5, wherein the plurality of vias substantially surround the integrated circuit.

11. The microelectronic die of claim 5, wherein the plurality of vias are filled.

* * * * *

UNITED STATES PATENT AND TRADEMARK OFFICE
CERTIFICATE OF CORRECTION

PATENT NO.          : 8,395,241 B2
APPLICATION NO.     : 12/918579
DATED               : March 12, 2013
INVENTOR(S)         : Cheng Yang et al.

It is certified that error appears in the above-identified patent and that said Letters Patent is hereby corrected as shown below:

In the Claims:

In column 9, line 44, in claim 1, after "surface;" delete "and".

In column 10, line 20, in claim 5, after "surface;" delete "and".

Signed and Sealed this
Twenty-eighth Day of May, 2013

Teresa Stanek Rea
*Acting Director of the United States Patent and Trademark Office*